United States Patent [19]
Kumano et al.

[11] Patent Number: 5,666,009
[45] Date of Patent: Sep. 9, 1997

[54] WIRE BONDING STRUCTURE FOR A SEMICONDUCTOR DEVICE

[75] Inventors: Hiroshi Kumano; Yasuyuki Higuchi, both of Kyoto, Japan

[73] Assignee: Rohm Co. Ltd., Kyoto, Japan

[21] Appl. No.: 661,144

[22] Filed: Jun. 10, 1996

Related U.S. Application Data

[63] Continuation of Ser. No. 242,637, May 13, 1994, abandoned.

[30] Foreign Application Priority Data

May 25, 1993 [JP] Japan ...................... 5-122285

[51] Int. Cl.$^6$ ................ H01L 23/48; H01L 23/52; H01L 29/40
[52] U.S. Cl. .................. 257/784; 257/786; 257/734
[58] Field of Search ................... 257/666, 784, 257/690, 691, 692, 734, 786

[56] References Cited

U.S. PATENT DOCUMENTS

| | | | |
|---|---|---|---|
| 3,795,845 | 3/1974 | Cass et al. | 257/786 |
| 4,403,240 | 9/1983 | Seki et al. | 257/784 |
| 4,959,706 | 9/1990 | Cusack et al. | 257/786 |
| 4,984,061 | 1/1991 | Matsumoto | 257/776 |
| 5,091,825 | 2/1992 | Hill et al. | 257/786 |
| 5,126,828 | 6/1992 | Hatta et al. | 257/786 |
| 5,173,762 | 12/1992 | Ota | 257/666 |
| 5,173,763 | 12/1992 | Ota | 257/666 |
| 5,194,931 | 3/1993 | Araki | 257/734 |
| 5,329,157 | 7/1994 | Rosotker | 257/786 |

FOREIGN PATENT DOCUMENTS

| | | | |
|---|---|---|---|
| 58-27345 | 2/1983 | Japan | 257/796 |
| 2144955 | 6/1990 | Japan . | |
| 3240248 | 10/1991 | Japan | 257/666 |

*Primary Examiner*—Mahshid D. Saadat
*Assistant Examiner*—Jhihan B. Clark
*Attorney, Agent, or Firm*—Nikaido Marmelstein Murray & Oram LLP

[57] ABSTRACT

In a transistor of a structure where a bonding pad formed on the surface of a chip and an end portion of a lead terminal are connected by a bonding wire, by forming the bonding pad to be long and narrow so that its length is parallel to a straight line between the bonding pad and the terminal end. The bonding pad and the terminal end are connected along the shortest line The width of the bonding pad is reduced to a minimum.

7 Claims, 5 Drawing Sheets

WIRE BONDING STRUCTURE FOR A SEMICONDUCTOR DEVICE

This application is a continuation of application Ser. No. 08/242,637 filed May 13, 1994, now abandoned.

BACKGROUND OF THE INVENTION

1. Field of the Invention

The present invention relates to a semiconductor device such as a transistor, and more particularly, to an improvement in a wire bonding structure for connecting a semiconductor chip and a lead terminal.

2. Description of the Prior Art

A conventional manner of bonding a transistor which is typical of a semiconductor device of this type is as shown in FIG. 1. Specifically, a chip 1 of the transistor device is die-bonded onto a mount portion 3 provided in the center of a lead frame 2, and bonding pads 4' and 5' respectively formed at the right and left sides on the obverse surface of the chip 1 and wide ends 6a and 7a of lead terminals 6 and 7 provided on both sides of the mount portion 3 are wire-bonded. With this bonding, a collector electrode formed on the reverse surface of the chip 1 is electrically connected to the mount portion 3, and a base electrode and an emitter electrode where the bonding pads 4' and 5' are provided are respectively connected to the lead terminals 6 and 7 by bonding wires 8.

In such a bonding structure, an aluminum wire which is inexpensive and highly practicable is widely used as the bonding wire 8. As the wire bonding method, a wedge bonding method is generally used.

Bonding by the wedge bonding method using the aluminum wire 8 is performed in a manner as shown in FIG. 7. First, in the first step, the wire 8 is supplied to the bonding pads 4' (5') from a wire feeding nozzle 9, and the tip of the wire 8 is fixed to the bonding pad 4' (5') by rubbing it by means of a head 10 by using supersonic waves. Then, in the second step, the head 10 is moved to the terminal end 6a along a predetermined line. Lastly, in the third step, an end portion 8a of the wire 8 at which the wire 8 is cut is rubbed by using supersonic waves to bond it to the terminal end 6a (7a).

Referring to FIG. 8a, there is shown a configuration of the wire end portion 8a connected to the bonding pad 4' formed on the surface of the chip 1. As shown in FIGS. 1 and 8a, the bonding pads 4' and 5' are formed to be longer along the sides of the chip 1, for example, to be rectangular, since it is necessary to rub the wires 8 on the pads 4' and 5' toward the front and rear of the figure. The wire end portions 8a fixed to the pads 4' and 5' are rubbed into a configuration extended toward both sides by receiving a rubbing force from the head 10.

It is necessary that the line along which the head 10 is moved in the second step be largely bent on the way. This is because the right and left lead terminals 6 and 7 are further displaced rightward and leftward by a predetermined amount relative to the right and left bonding pads 4' and 5' since a lead terminal 3a extending from the mount portion 3 is inevitably located between the lead terminals 6 and 7. Therefore, with this bonding structure, the wires 8 connecting the bonding pads 4' and 5' and the terminal ends 6a and 7a are largely bent on the way. Accordingly, the time required for the bonding process increases, so that the quantity of production per unit time is largely restricted.

Further, with this conventional bonding structure, when it is employed for a transistor, it is difficult to arrange an emitter region formed around the bonding pads 4' and 5', so as to form a symmetrical pattern, since the bonding pads 4' and 5' serving as the base electrode and the emitter electrode, respectively, are provided in parallel on the chip surface. For this reason, obtaining a required performance as a transistor and achieving a reduction in size of the chip are hardly compatible with each other.

To solve the above-mentioned problem, the head 10 may be moved along straight lines connecting the bonding pads 4' and 5' and the terminal ends 6a and 7a. That is, the head 10 is linearly moved while being inclined at a necessary angle to the sides of the chip 1. In this case, however, since the wire end portions 8a are fixed to the bonding pads 4' and 5' obliquely to the rectangular pads 4' and 5' as shown in FIG. 8b, it is necessary to form the pads 4' and 5' to be wider in order that the wire end portions 8a rubbed by the head 10 into a configuration extended toward both sides do not protrude from the pads 4' and 5'.

However, for example in the above-described transistor, if the bonding pads 4' and 5' are wider, the effective emitter active region formed around the bonding pads 4' and 5' does not reach the central portions of the pad regions, and accordingly, it is necessary to increase the size of the chip 1. As a result, the cost increases.

SUMMARY OF THE INVENTION

An object of the present invention is to provide a small-size semiconductor device achieving a high turnover of production, a mass productivity and an improved performance by a simple method.

To attain the above-mentioned object, according to the present invention, in a semiconductor device where a bonding pad formed on a surface of the semiconductor chip and a terminal end of the lead terminal are connected with a bonding wire to connect the chip and the lead terminal electrically, the bonding pad is arranged along a straight line between the bonding pad and the terminal end.

According to this feature, since, when the bonding pad and the terminal end electrically connected by the bonding wire, the movement amount of a head used to fix the wire to the bonding pad and the terminal end is reduced to an irreducible minimum, the quantity of production per unit time, i.e. the turnover of production is largely improved. Since the bonding wire is arranged along the shortest line, damage due to the pressure when resin is injected is reduced, so that the fault is prevented to the utmost. Further, since the bonding pad is arranged along the wire, the width of the bonding pad can be reduced to a minimum.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
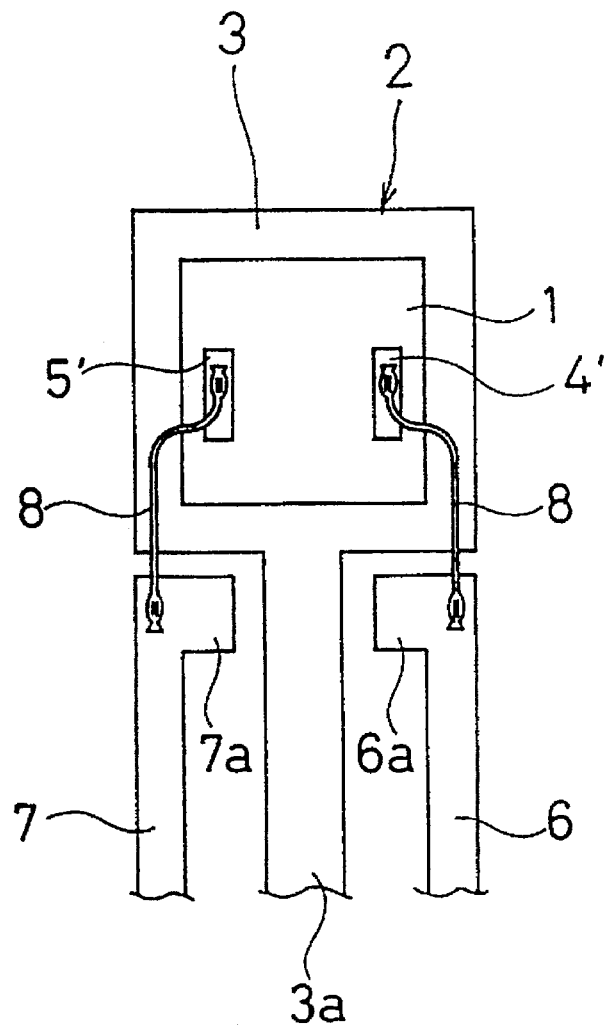
FIG. 1 is a plan view showing a conventional manner of bonding a semiconductor chip and a lead terminal.
Figure 2:
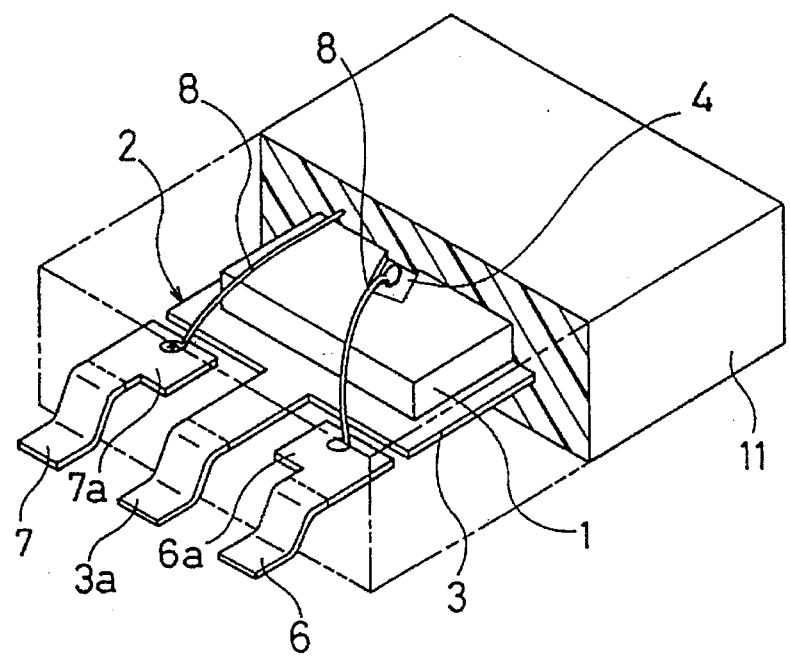
FIG. 2 is a partially cutaway perspective view showing a transistor embodying the present invention.
Figure 3:
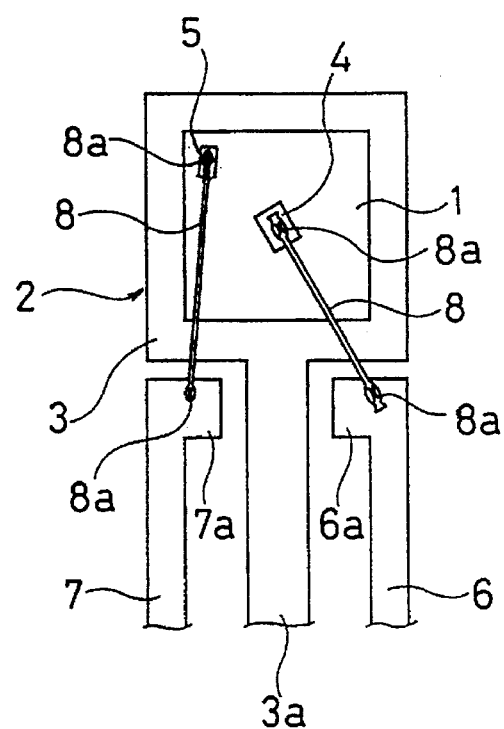
FIG. 3 is a plan view showing a manner of bonding a device chip and a lead terminal according to the present invention.

Hereinafter, an embodiment of the present invention will be described with reference to the drawings. In this embodiment, the present invention is employed for a transistor. Common elements and portions having common workings to those of the previously-described conventional structure are denoted by the same reference designations. FIG. 2 shows a general arrangement of a transistor according to the present invention. FIG. 3 shows a manner of bonding a transistor chip and a lead terminal.

As shown in these figures, in this embodiment, a transistor chip 1 is die-bonded to a mount portion 3 provided in the center of a lead frame 2. The reverse surface of the chip i forms a collector electrode, which is electrically connected to the mount portion 3 by the die-bonding of the chip 1 to the mount portion 3.

On the surface of the chip 1, bonding pads 4 and 5 corresponding to an emitter electrode and a base electrode, respectively, are formed. From the mount portion 3 of the lead frame 2, a lead terminal 3a is extended. On both sides of the lead terminal 3a, two lead terminals 6 and 7 serving as an emitter terminal and a base terminal, respectively, are arranged to be insulated from the mount portion 3. At end portions of the emitter and base lead terminals 6 and 7, wide terminal ends 6a and 7a are formed integrally. The terminal ends 6a and 7a and the bonding pads 4 and 5 are electrically connected by bonding wires 8.

After the fixing of the chip 1 to the mount portion 3 and the bonding of the chip 1 and the lead terminals 6 and 7 are completed, the central portion including the chip 1, the mount portion 3, the base portion of the lead terminal 3a and the terminal ends 6a and 7a of the lead terminals 6 and 7 is encapsulated in a resin 11.

In this embodiment, the other end portions of the lead terminals 6 and 7 projecting out of the resin 11 are bent so as to project toward substantially the same level with or slightly below the bottom surface of the resin 11 at need as shown in FIG. 2 in order that the end portions come into contact with, for example, a circuit board (not shown). However, the configuration of these end portions is not limited thereto. The end portions may take various configurations according to the use; they may be straight without being bent or may be bent in a different direction.

Figure 5:
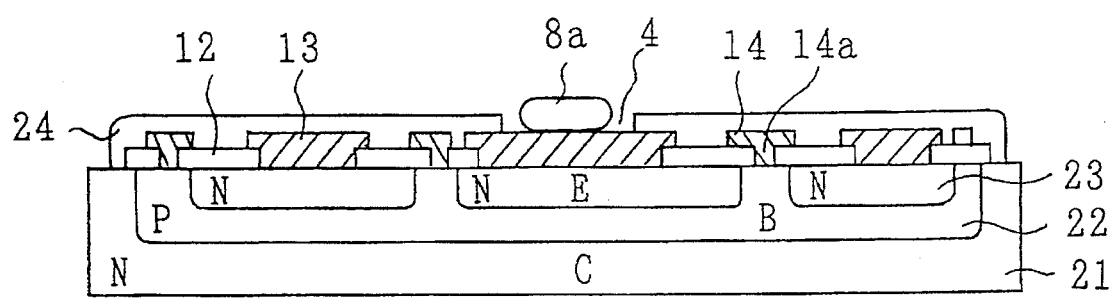
FIG. 5 is a schematic view showing a cross section of the chip taken on line 16—16 of FIG. 4.

Referring to FIG. 5, there is shown a cross-sectional structure of the transistor chip of this embodiment. An N-type semiconductor substrate 21 constitutes a collector C of the transistor. A P-type region 22 formed in the substrate 21 constitutes a base B. An N-type region 23 formed in the P-type region 22 constitutes an emitter E. The surface of the base B is covered with an $SiO_2$ film 12, which also covers a part of the surface of the emitter E in the vicinity. Outside the film 12, an aluminum emitter interconnection 13 and an aluminum base interconnection 14 are formed. The emitter E is directly connected to the emitter interconnection 13. The base B is connected to the base interconnection 14 through a contact hole 14a formed in the $SiO_2$ film 12. The upper surface of the chip 1 on which the interconnections have been formed is wholly covered with an $Si_3N_4$ film 24. By partly disclosing the aluminum for the interconnections by removing the $Si_3N_4$ film 24 at predetermined portions, the bonding pads 4 and 5 are formed.

According to the present invention, in a transistor having the above-described basic structure, an aluminum wire is used as the bonding wire 8, and the bonding pads 4 and 5 and the terminal ends 6a and 7a are bonded by the wedge bonding method. Further, to improve the productivity and the performance of the device, the bonding pads 4 and 5 formed on the surface of the chip 1 are arranged in a unique manner so far unknown.

Specifically, the bonding pads 4 and 5 formed at two portions serving as the emitter electrode and the base electrode are respectively arranged along straight lines (hereinafter referred to as "projected straight lines") obtained by perpendicularly projecting the straight lines between the pad 4 or 5 and the terminal end 6a or 7a onto the surface of the chip 1.

The emitter bonding pad 4 is arranged at the center of the chip surface. The base bonding pad 5 is arranged in a corner of the chip surface, in a left corner which is farther from the base terminal end 7a in the example of FIG. 3.

Figure 7:
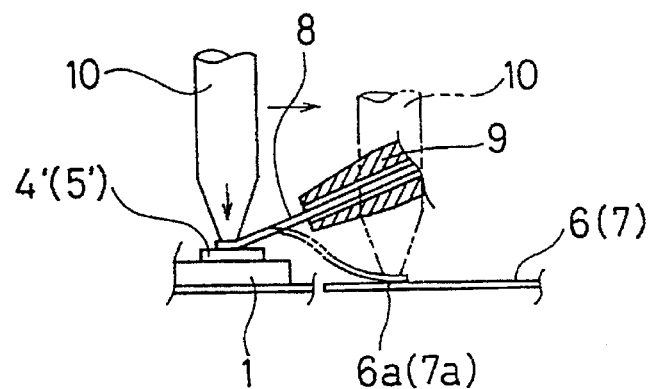
FIG. 7 is a side view schematically showing an example of wedge bonding.

The emitter pad 4 is rectangular. The longer sides thereof are parallel to the projected straight line between the pad 4 and the terminal end 6a. The base pad 5 is also rectangular. The longer sides thereof are parallel to the projected straight line between the pad 5 and the terminal end 7a. Consequently, when the bonding wire 8 is fixed to the pad 4 and to the terminal end 6a by means of the head 10 used in the wedge boding method as shown in FIG. 7, after the fixing of the wire end portion 8a to the pad 4 by the head 10 is completed, the head 10 can be moved linearly toward the terminal end 6a, i.e. along the shortest line. Likewise, when the wire 8 is applied between the base pad 5 and the terminal end 7a, the head 10 is moved along the shortest line. Since the time required to move the head 10 in the wire bonding process is remarkably decreased, the production efficiency is largely increased.

The inventors of the present invention made a measurement on an experimental basis to find that a turnover of production approximately 2.5 times the turnover of production of the conventional structure is obtained. Moreover, since the wire 8 is arranged along the shortest line between the pad 4(5) and the terminal end 6a (7a) according to the present invention, it is prevented to the utmost that the wire 8 is deformed by the pressure caused by the resin when the device is encapsulated in resin.

Figure 4:
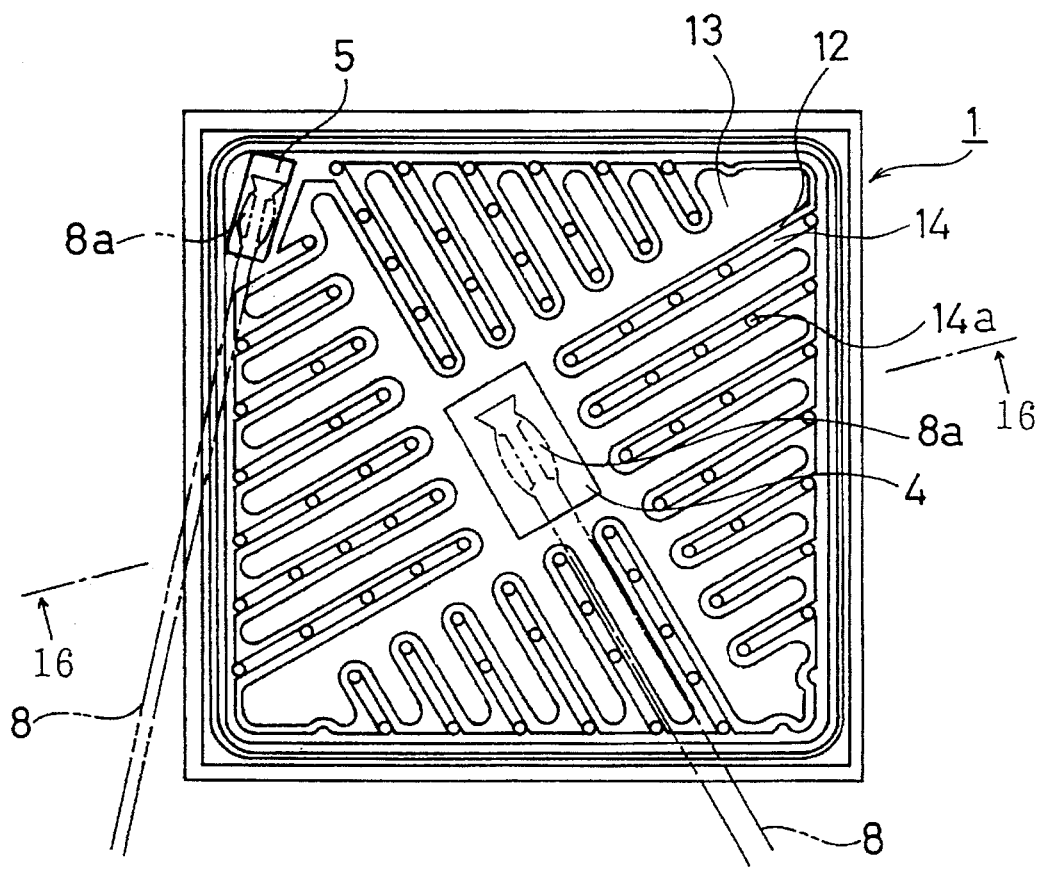
FIG. 4 is an enlarged plan view of the chip showing emitter and base interconnection patterns in an embodiment of the present invention.

Referring to FIG. 4, there are shown the emitter and base interconnections formed on the chip 1. The emitter interconnection 13 and the base interconnection 14 are separated by the insulating region 12 made of $SiO_2$. FIG. 5 is a schematic cross-sectional view of the chip 1 taken on line 16—16 of FIG. 4. As shown in FIG. 4, by arranging the emitter pad 4 at the center of the chip surface, the emitter and base interconnections are nearly of point symmetry. This enables the arrangement of the emitter and base regions in the chip 1 to be substantially symmetrical with respect to the center of the chip 1. The comb-teeth-shaped emitter and base interconnections 13 and 14 are inclined at the same angle to the chip 1 as the angle at which the pad 4 is inclined. They form a fylfot pattern as a whole.

As described above, according to the present invention, the emitter pad 4 is easily formed at the center of the chip surface. Consequently, the emitter region and the base region are realized in a pattern where they are inclined respectively at an angle of the projected straight line between the pad 4 and the terminal end 6a to the chip 1 and at 90 degrees to the projected straight line. Since the region pattern is highly symmetrical, the concentration of the current is effectively prevented and a device which is resistant to breakage is realized. Moreover, compared to the conventional structure where it is difficult to realize a symmetrical pattern, a reduction in collector-emitter saturation voltage $V_{CE}(sat)$, an increase in maximum collector current $I_C(peak)$, an extension in area of safety operation ASO and an improvement in $h_{FE}$ current dependency are achieved.

Figure 6A:
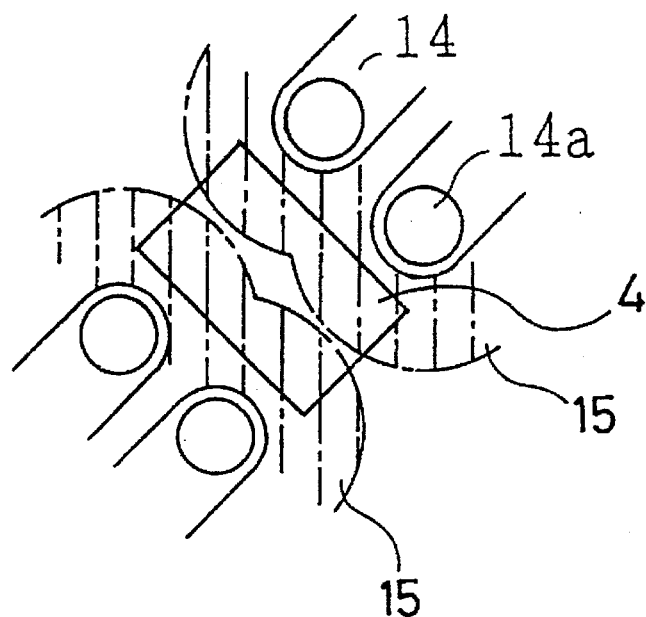
FIG. 6a is a schematic view showing an emitter active region in the embodiment of the present invention.
Figure 6B:
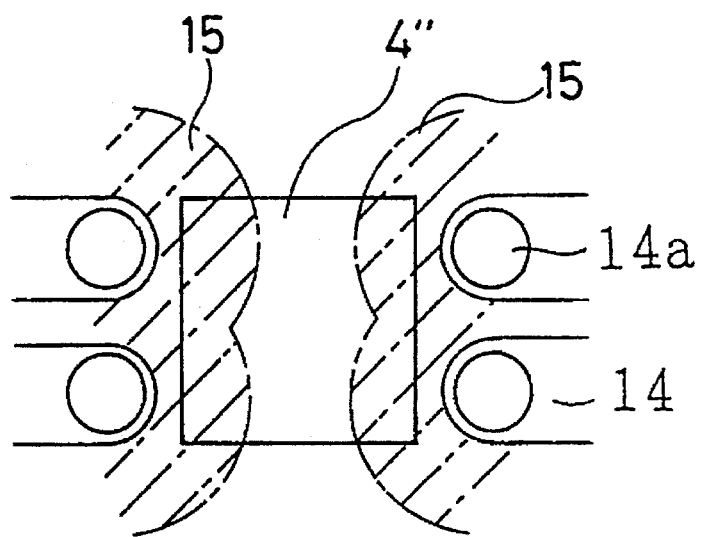
FIG. 6b is a schematic view showing an emitter active region when a bonding pad is wider.
Figure 8A:
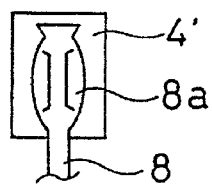
FIG. 8a is a plan view showing a fixing condition of a bonding wire when a rectangular bonding pad is parallel to the bonding wire.
Figure 8B:
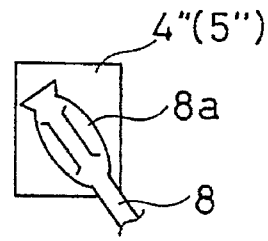
FIG. 8b is a plan view showing a fixing condition of the bonding wire when the rectangular bonding pad is oblique to the bonding wire.
Figure 8C:
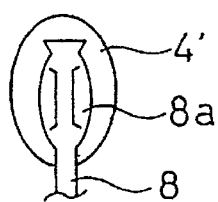
FIG. 8c is a plan view showing a fixing condition of the boding wire when the major axis of an oval bonding pad is parallel to the bonding wire.

Since the wire end portions 8a fixed to the bonding pads 4 and 5 are rubbed by the head 10 into a configuration extended toward both sides as described previously, it is necessary that the pads 4 and 5 be formed wider than the deformed wire end portions 8a. According to the present invention, since the pads 4 and 5 are formed along the bonding wires 8 and the directions of the rubbing of the wire end portions 8a by the head 10 coincide with the directions along the lengths of the bonding pads 4 and 5, the widths of the pads 4 and 5 can be reduced to a minimum (see FIG. 8a). If the bonding pads 4 and 5 intersect the bonding wires 8 obliquely, it is necessary that the pads 4 and 5 be wider as shown in FIG. 8b. In that case, as shown in FIG. 6b, even if the base B is formed to be as close to an emitter bonding pad 4" as possible within a range in which the base interconnection 14 or the base contact hole 14a does not come in contact with the pad 4", an emitter active region 15 indicated by the slanting lines does not extend to the entire pad 4". That is, an inactive region is left below the emitter bonding pad 4". On the contrary, in the structure of the present invention shown in FIG. 6a, since the widths of the pads 4 and 5 are reduced to a minimum, the emitter active region 15 extends to nearly the entire pads 4 and 5, and accordingly, the emitter active region is relatively large. This means that the ratio of the emitter active region to the entire chip 1 is largely improved. Therefore, when a chip 1 having the same performance is made, it is possible to decrease the dimensions of the chip 1 to reduce the size and cost of the device. The same advantages are obtained when the bonding pads 4 and 5 are not rectangular but oval as shown in FIG. 8c.

In the above-described embodiment, the emitter pad 4 is arranged at the center of the chip surface and the inclined pattern of the emitter and base interconnections 13 and 14 is of point symmetry with respect to the pad 4. However, since the degree of freedom of the arrangement of the pads is high in the device of the present invention, the pads 4 and 5 may be arranged at any positions other than the center of the chip surface. Moreover, the structures of the emitter and base interconnections 13 and 14 may arbitrarily be selected.

Further, the present invention is applicable to a device other than the transistor, for example to an integrated circuit (IC). While the bonding pads are rectangular in the above description, they are not limited thereto; they may be of any configurations as far as they are long and narrow. For example, they may be oval as shown in FIG. 8c. The configurations of the bonding pads may be decided in consideration of the processing time and the degree of technical difficulty.

As described above, in a semiconductor device according to the present invention, since the bonding pad is arranged along the projected straight line between the pad and the terminal end of the lead terminal, the movement amount of the head is reduced to an irreducible minimum in electrically connecting the pad and the terminal end. As a result, the quantity of production per unit time is largely improved.

Further, since the width of the bonding pad is reduced to a minimum, when the present invention is employed, for example, for a transistor, the emitter active region is largely extended. As a result, the size and the cost of the device are reduced.

Obviously, many modifications and variations of the present invention are possible in light of the above teachings. It is therefore to be understood that within the scope of the appended claims, the invention may be practiced other than as specifically described.

What is claimed is:

1. A semiconductor device having a rectangular semiconductor chip having sides and a lead terminal adjacent the semiconductor chip, said semiconductor device comprising:

a bonding pad formed on a surface of the semiconductor chip;

a wide terminal end formed on the lead terminal; and a bonding wire electrically a) connected to the wide terminal end by wedge bonding and b) connected to the bonding pad by wedge bonding, wherein the bonding pad has sides which extend parallel to a direction along a projected straight line, said projected straight line connects a bonding point on the bonding pad and a bonding point on the wide terminal end and, wherein said sides of said bonding pad incline at an angle relative to each side of said semiconductor chip.

2. A semiconductor device comprising:

a rectangular semiconductor chip having sides, and on a surface of said semiconductor chip a long and narrow bonding pad is formed;

a lead terminal having a wide terminal end; and a bonding wire for electrically connecting the semiconductor chip and the lead terminal, said bonding wire being connected to the bonding pad at one end by wedge bonding and to the wide terminal end at another end by wedge bonding, wherein the bonding wire is arranged to form a straight line between a bonding point on the bonding pad and a bonding point on the wide terminal end and wherein the bonding pad is formed to have sides which extend in parallel to the straight line and, wherein said sides of said bonding pad incline at an angle relative to each side of said semiconductor chip.

3. A semiconductor device according to claim 2, comprising a transistor chip where two bonding pads for use as an emitter electrode and as a base electrode are formed, and two lead terminals connected to the bonding pads.

4. A semiconductor device according to claim 2, wherein the bonding pad is rectangular.

5. A semiconductor device according to claim 3, wherein the bonding pad for use as an emitter electrode is formed at a center of the semiconductor chip, and the bonding pad for use as a base electrode is formed at a periphery of the semiconductor chip.

6. A semiconductor device according to claim 5, wherein an interconnection pattern on the semiconductor chip formed by an emitter interconnection and a base interconnection is substantially symmetrical with respect to the center of the semiconductor chip.

7. A semiconductor device comprising:

a rectangular semiconductor chip having sides, and on a surface of said semiconductor chip a long and narrow bonding pad is formed;

a lead terminal having a wide terminal end; and a bonding wire for electrically connecting the semiconductor chip and the lead terminal, said bonding wire being connected to the bonding pad at one end by wedge bonding and to the wide terminal end at another end by wedge bonding, wherein the bonding wire is arranged to form a straight line between a bonding point on the bonding pad and a bonding point on the wide terminal end, and wherein the bonding pad is formed to be an ellipse having a major axis parallel to the straight line and, wherein said major axis inclines at an angle relative to each side of said semiconductor chip.

* * * * *